United States Patent
Lu et al.

(10) Patent No.: US 10,164,650 B2
(45) Date of Patent: Dec. 25, 2018

(54) DELAY-FREE POLY-PHASE QUANTIZER AND QUANTIZATION METHOD FOR PWM MISMATCH SHAPING

(71) Applicant: QUALCOMM Incorporated, San Diego, CA (US)

(72) Inventors: Jingxue Lu, San Diego, CA (US); Matthew Sienko, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/435,155

(22) Filed: Feb. 16, 2017

(65) Prior Publication Data

US 2018/0234101 A1  Aug. 16, 2018

(51) Int. Cl.
  *H03M 1/06* (2006.01)
  *H03M 3/00* (2006.01)
(52) U.S. Cl.
  CPC ........... *H03M 1/0617* (2013.01); *H03M 3/50* (2013.01)
(58) Field of Classification Search
  CPC ........ H03M 1/0617; H03M 1/50; H03M 3/50; H03M 1/822; H03K 5/135; G09G 2310/066
  USPC .......................... 341/143, 155, 157, 166, 118
  See application file for complete search history.

(56) References Cited

U.S. PATENT DOCUMENTS

| | | |
|---|---|---|
| 5,392,040 A | 2/1995 | Hayashi |
| 6,373,417 B1 | 4/2002 | Melanson |
| 7,138,935 B1 | 11/2006 | Damphousse et al. |
| 7,184,480 B1 | 2/2007 | Gheorghiu |
| 7,420,494 B1 | 9/2008 | Schreier |

(Continued)

FOREIGN PATENT DOCUMENTS

| | | | | |
|---|---|---|---|---|
| EP | 1858159 A1 | 11/2007 | | |
| WO | WO2004/004111 | * 6/2003 | ................ | H02P 6/16 |

(Continued)

OTHER PUBLICATIONS

Chen Z-Y., et al., "DLL-Based Pulse-Width Modulation Digital-to-Analog Converter for Continuous-Time Sigma Delta Modulators", IEEE, International Midwest Symposium on Circuits and Systems (MWSCAS), 2014, pp. 757-760.

(Continued)

*Primary Examiner* — Peguy Jean Pierre
(74) *Attorney, Agent, or Firm* — Paradice and Li LLP/Qualcomm

(57) ABSTRACT

A system and method for pulse-width modulation (PWM) mismatch shaping. The method includes receiving a multi-bit pulse-code modulated (PCM) signal and generating a voltage ramp signal. The method includes generating a first corrected signal based on a first feedback signal and the multi-bit PCM signal. The method includes generating a first single-bit PWM signal based on the first corrected signal and the voltage ramp signal. The method includes delaying the voltage-ramp signal and generating a second corrected signal based on a second feedback signal and the multi-bit PCM signal. The method includes generating a second single-bit PWM signal based on the second corrected signal and the delayed voltage ramp signal and generating a multi-bit pulse-density modulation (PDM) signal based on the first single-bit PWM signal and the second single-bit PWM signal.

28 Claims, 4 Drawing Sheets

(56) References Cited

U.S. PATENT DOCUMENTS

| | | | |
|---|---|---|---|
| 9,166,615 | B2 | 10/2015 | Kinyua |
| 9,866,188 | B2 * | 1/2018 | Chang .................. H03F 3/2171 |
| 2007/0286273 | A1 * | 12/2007 | Clara ..................... H03F 3/217 375/238 |
| 2009/0135038 | A1 | 5/2009 | Das |
| 2010/0109768 | A1 * | 5/2010 | Kotowski ............... H03F 3/217 330/10 |
| 2014/0347128 | A1 * | 11/2014 | Crippa ................. H03F 3/2175 330/251 |
| 2016/0065178 | A1 | 3/2016 | Chappaz |
| 2016/0126968 | A1 | 5/2016 | Lesso et al. |

FOREIGN PATENT DOCUMENTS

| | | |
|---|---|---|
| WO | WO-2007038474 A2 | 4/2007 |
| WO | WO-2013072186 A1 | 5/2013 |

OTHER PUBLICATIONS

Danesh S., et al., "A Reconfigurable 1 GSps to 250 MSps, 7-Bit to 9-Bit Highly Time-Interleaved Counter ADC with Low Power Comparator Design," IEEE Journal of Solid-State Circuits, IEEE Service Center, Piscataway, NJ, USA, vol. 48, No. 3, Mar. 1, 2013 (Mar. 1, 2013), XP011494566, pp. 733-748, ISSN: 0018-9200, DOI: 10.1109/JSSC.2013.2237672.

International Search Report and Written Opinion—PCT/US2018/013879—ISA/EPO—dated Jun. 22, 2018.

Pakniat H., et al., "A Time-Domain Noise-Coupling Technique for Continuous-Time Sigma-Delta Modulators," Analog Integrated Circuits and Signal Processing, Springer New York LLC, US, vol. 78, No. 2, Nov. 1, 2013 (Nov. 1, 2013), XP035311610, pp. 439-452, ISSN: 0925-1030, DOI: 10.1007/S10470-013-0219-3 [retrieved on Nov. 1, 2013].

* cited by examiner

DELAY-FREE POLY-PHASE QUANTIZER AND QUANTIZATION METHOD FOR PWM MISMATCH SHAPING

BACKGROUND

Aspects of the present disclosure relate generally to shaping digital signals to suppress quantization noise for digital-to-analog converter (DAC) applications, and more particularly, to a delay-free poly-phase quantizer for pulse-width modulation (PWM) mismatch shaping.

A digital to analog converter (DAC) converts a digital signal to an analog voltage or current. The signal-to-noise-and-distortion ratio (SNDR) of a DAC indicates the ratio between the powers of the converted main signal and the sum of the noise and the generated harmonic spurs. Modern telecommunication systems running at high data rates and high receiver sensitivity require a DAC to perform with a high SNDR. To meet such stringent requirements, telecommunication system designers implement design techniques to improve the performance for delta-sigma modulators that drive such DACs.

SUMMARY

The delta-sigma modulator herein utilizes a delay-free poly-phase PWM quantizer that has advantages over the prior art. For example, the poly-phase PWM quantizer generates single-bit poly-phase pulse-width modulation (PWM) signals from a high bit-width pulse-code modulation (PCM) signal by using a plurality of PWM modulators and summing each of their single bit-width PWM signals into a low bit-width PDM signal. The direct conversion from PCM signal format to both PDM and PWM signal formats within the poly-phase PWM quantizer advantageously avoids the need to filter the extra distortion caused by separate digital signal conversion stages. Furthermore, the poly-phase PWM quantizer includes a local feedback configuration for each single-bit PWM modulator making its output more tolerant to the element mismatch of the downstream digital-to-analog converter (DAC). As such, the features of both the single-stage signal conversion and local feedback enhance the signal-to-noise distortion ratio (SNDR) for the single-bit PWM signals and the constructed PDM signal. Accordingly, designers may overcome the challenges of element mismatch when designing a DAC by simply driving the DAC with the high SNDR signals generated from a delay-free poly-phase PWM quantizer.

One implementation disclosed herein is a delta-sigma modulator for pulse-width modulation (PWM) mismatch shaping. The delta-sigma modulator includes a first PWM modulator having a first input terminal, a second input terminal, and an output terminal. The delta-sigma modulator also includes a voltage ramp generator having an output terminal coupled to the second input terminal of the first PWM modulator. The delta-sigma modulator further includes a first delay element having an input terminal and an output terminal. The input terminal of the first delay element is coupled to the output terminal of the voltage ramp generator.

The delta-sigma modulator includes a second PWM modulator having a first input terminal coupled to the first input terminal of the first PWM modulator, a second input terminal, and an output terminal. The second input terminal of the second PWM modulator being coupled to the output terminal of the first delay element. The delta-sigma modulator also includes a loop filter having a first input terminal, a second input terminal, and an output terminal. The output terminal of the loop filter couples to the first input terminal of the first PWM modulator and the first input terminal of the second PWM modulator.

In some implementations, the voltage ramp generator generates a sequence of reference voltages based on a transfer function of a digital word stored in a counter circuit. In some implementations, the delta-sigma modulator further includes a combiner having a first input terminal coupled to the output terminal of the first PWM modulator, a second input terminal coupled to the output terminal of the second PWM modulator, and an output terminal coupled to the second input terminal of the loop filter. In some implementations, the loop filter being adapted to receive a multi-bit pulse code modulated (PCM) signal and the combiner being adapted to generate a multi-bit pulse density modulated (PDM) signal. In some implementations, the first PWM modulator generates a first single-bit PWM signal and the second PWM modulator generates a second single-bit PWM signal.

In some implementations, the first PWM modulator generates a first single-bit PWM signal by comparing a first voltage on the first terminal of the first PWM modulator to a second voltage on the second input terminal of the first PWM modulator. In some implementations, the output terminal of the first PWM modulator being coupled to a digital-to-analog converter (DAC). In some implementations, the delta-sigma modulator further includes a second delay element having an input terminal coupled to the output terminal of the first delay element and a third PWM modulator having a first input terminal coupled to the output terminal of the loop filter and a second input terminal coupled to the output terminal of the second delay element. In some implementations, the first delay element delays a signal by a first delay amount, wherein the second delay amount delays a signal by a second delay amount, and wherein the first delay amount and the second delay amount being equal to one period of a sampling clock signal.

In another aspect, the present disclosure is directed to a delta-sigma modulator for pulse-width modulation (PWM) mismatch shaping. The delta-sigma modulator including a first PWM modulator having a first input terminal, a second input terminal, and an output terminal. The delta-sigma modulator includes a voltage ramp generator having an output terminal coupled to the second input terminal of the first PWM modulator. The delta-sigma modulator includes a second PWM modulator having a first input terminal, a second input terminal, and an output terminal. The delta-sigma modulator includes a local filter having an input terminal and an output terminal, the output terminal of the local filter being coupled to the first input terminal of the first PWM modulator. In some implementations, the delta-sigma modulator includes a subtractor having a first and second input terminal and an output terminal, the output terminal being coupled to the input terminal of the local filter. In some implementations, the delta-sigma modulator includes a loop filter having a first input terminal, a second input terminal, and an output terminal. The output terminal of the loop filter being coupled to the first input terminal of the subtractor.

In some implementations, the delta-sigma modulator includes another local filter having an input terminal and an output terminal, the output terminal of the other local filter being coupled to the first input terminal of the second PWM modulator. In some implementations, the delta-sigma modulator includes another subtractor having first and second input terminals and an output terminal, the output terminal being coupled to the input terminal of the other local filter.

In some implementations the voltage ramp generator generates a sequence of reference voltages based on a transfer function of a digital word stored in a counter circuit. In some implementations, the second input terminal of the subtractor being coupled to the output terminal of the first PWM modulator. In some implementations, the delta sigma modulator includes a first delay element having an input terminal coupled to the output terminal of the voltage ramp generator and an output terminal coupled to the second input terminal of the second PWM modulator. In some implementations, the delta-sigma modulator includes a second delay element having an input terminal coupled to the output terminal of the first delay element and a third PWM modulator having a first input terminal coupled to the output terminal of the loop filter and a second input terminal coupled to the output terminal of the second delay element.

In some implementations, the first delay element delays a signal by a first delay amount. The second delay element delays a signal by a second delay amount, and the second delay amount being greater than the first delay amount. In some implementations, the delta-sigma modulator includes a combiner having a first input terminal coupled to the output terminal of the first PWM modulator, a second input terminal coupled to the output terminal of the second PWM modulator, and an output terminal coupled to the second input terminal of the loop filter.

In some implementations, the loop filter adapted to receive a multi-bit pulse code modulated (PCM) signal and the combiner adapted to generate a multi-bit pulse density modulated (PDM) signal. In some implementations, the first PWM modulator generates a first single-bit PWM signal and the second PWM modulator generates a second single-bit PWM signal. In some implementations, the first PWM modulator generates a first single-bit PWM signal by comparing a first voltage on the first terminal of the first PWM modulator to a second voltage on the second input terminal of the first PWM modulator. In some implementations, the output terminal of the first PWM modulator being coupled to a digital-to-analog converter (DAC).

In another aspect, the present disclosure is directed to a method for pulse-width modulation (PWM) mismatch shaping. The method includes receiving a multi-bit pulse-code modulated (PCM) signal and generating a voltage ramp signal. The method includes generating a first corrected signal based on a first feedback signal and the multi-bit PCM signal. The method includes generating a first single-bit PWM signal based on the first corrected signal and the voltage ramp signal. The method includes delaying the voltage-ramp signal and generating a second corrected signal based on a second feedback signal and the multi-bit PCM signal. The method includes generating a second single-bit PWM signal based on the second corrected signal and the delayed voltage ramp signal and generating a multi-bit pulse-density modulation (PDM) signal based on the first single-bit PWM signal and the second single-bit PWM signal.

In some implementations, the method includes generating the first corrected signal comprises subtracting the first feedback signal from the multi-bit PCM signal, and generating the second corrected signal comprises subtracting the second feedback signal from the multi-bit PCM signal. In some implementations, the method includes generating a first single-bit PWM signal comprises comparing the first corrected signal and the voltage ramp signal, and generating a second single-bit PWM signal comprises comparing the second corrected signal and the delayed voltage ramp signal. In some implementations, the first corrected signal being filtered prior to generating the first single-bit PWM signal, and the second corrected signal being filtered prior to generating the second single-bit PWM signal. In some implementations, the method includes generating a multi-bit pulse-density modulation (PDM) signal comprises combining the first single-bit PWM signal and the second single-bit PWM signal.

In some implementations, the method includes generating a multi-bit PWM signal based on the first single-bit PWM signal and the second single-bit PWM signal. In some implementations, the multi-bit PCM signal being generated based on integrating a second multi-bit PCM signal and the multi-bit PDM signal. In some implementations, the multi-bit PCM signal being generated based on integrating a second multi-bit PCM signal and the first single-bit PWM signal.

In another aspect, the present disclosure is directed to a non-transitory computer readable storage medium to store a computer program to execute a method for pulse-width modulation (PWM) mismatch shaping. The method including generating a multi-bit pulse-code modulated (PCM) signal. The method includes generating a voltage ramp signal. The method includes generating a first corrected signal based on a first feedback signal and the multi-bit PCM signal. The method includes generating a first single-bit PWM signal based on the first corrected signal and the voltage ramp signal. The method includes delaying the voltage-ramp signal. The method includes generating a second corrected signal based on a second feedback signal and the multi-bit PCM signal. The method includes generating a second single-bit PWM signal based on the second corrected signal and the delayed voltage ramp signal and generating a multi-bit pulse-density modulation (PDM) signal based on the first single-bit PWM signal and second single-bit PWM signal.

In some implementations, the multi-bit PCM signal being generated based on integrating a second multi-bit PCM signal and the multi-bit PDM signal.

BRIEF DESCRIPTION OF THE DRAWINGS

The accompanying drawings, which are incorporated herein and constitute part of this specification, illustrate examples described in the disclosure, and together with the general description given above and the detailed description given below, serve to explain the features of the various implementations.

Like reference numbers and designations in the various drawings indicate like elements.

DETAILED DESCRIPTION

Various implementations will be described in detail with reference to the accompanying drawings. Wherever possible, the same reference numbers may be used throughout the drawings to refer to the same or like parts. Different reference numbers may be used to refer to different, same, or similar parts. References made to particular examples and implementations are for illustrative purposes, and are not intended to limit the scope of the disclosure or the claims.

It should be understood that implementations of the present disclosure may be used in a variety of applications. Although the present disclosure is not limited in this respect, the circuits disclosed herein may be used in many apparatuses such as in the transmitters, receivers, and modems of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCS), personal digital assistants (PDA's) and the like.

Figure 1:
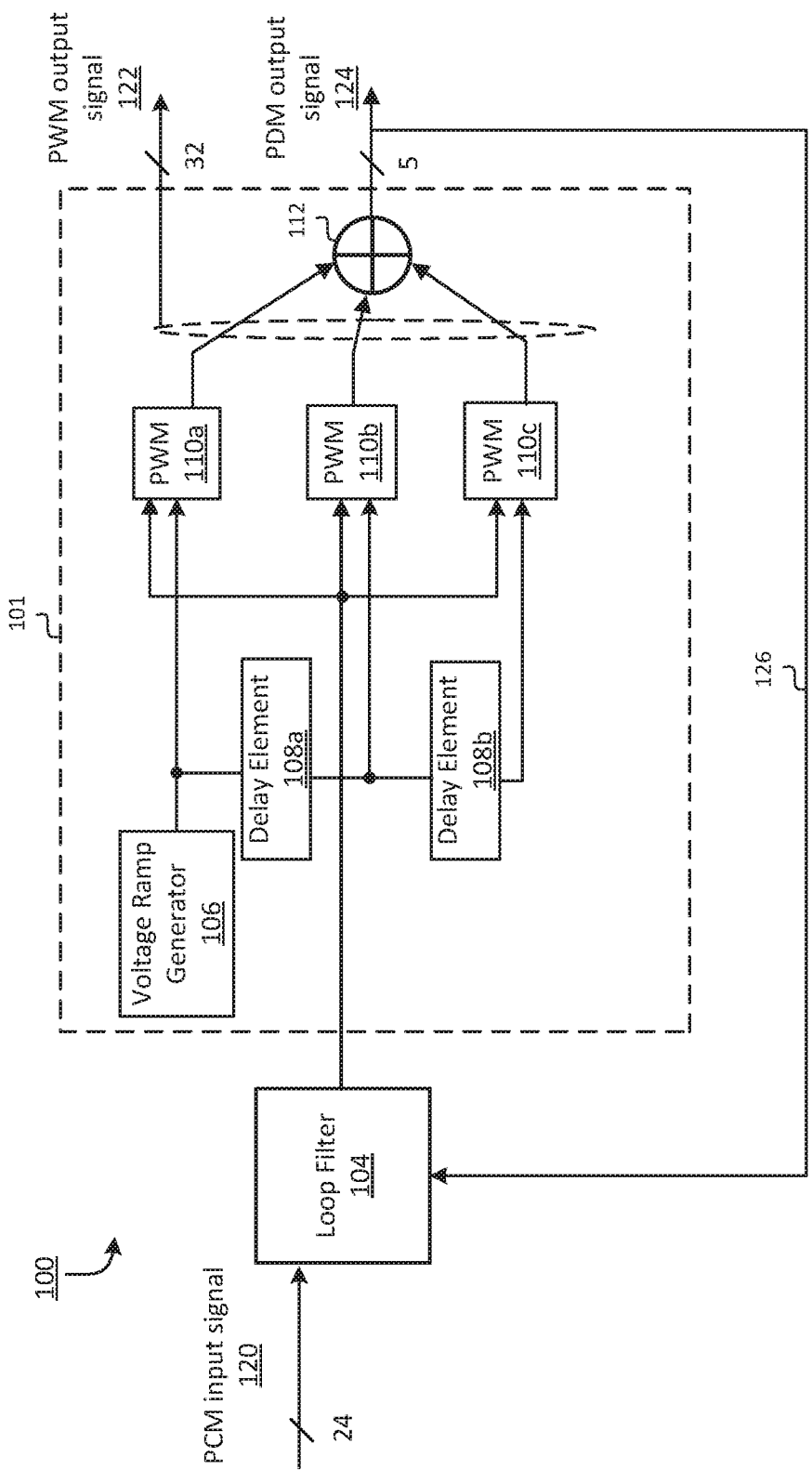
FIG. 1 is a block diagram depicting a delta-sigma modulator 100 including a delay-free poly-phase quantizer for pulse-width modulation (PWM) mismatch shaping to suppress quantization noise, in accordance with an illustrative implementation.

Types of cellular radiotelephone communication systems intended to be within the scope of the present disclosure include, but are not limited to, Frequency Division Multiple Access (FDMA) systems, Time Division Multiple Access (TDMA) systems, Extended-TDMA (E-TDMA) cellular radiotelephone systems, Global System for Mobile Communications (GSM) systems, Code Division Multiple Access (CDMA) systems (particularly, Evolution-Data Optimized (EVDO) systems), CDMA-2000 systems, Universal Mobile Telecommunications Systems (UMTS) (particularly, Wideband Code Division Multiple Access (WCDMA), Long Term Evolution (LTE) systems, Single Radio LTE (SRLTE) systems, Simultaneous GSM and LTE (SGLTE) systems, High-Speed Downlink Packet Access (HSDPA) systems, and the like), Code Division Multiple Access 1x Radio Transmission Technology (1x) systems, General Packet Radio Service (GPRS) systems, Wi-Fi systems, Bluetooth systems, Near-Field Communication systems, Personal Communications Service (PCS) systems, and other protocols that may be used in a wireless communications network or a data communications network FIG. 1 is a block diagram depicting a delta-sigma modulator 100 including a delay-free poly-phase quantizer for pulse-width modulation (PWM) mismatch shaping to suppress quantization noise, in accordance with an illustrative implementation. In general, the delta sigma modulator 100 converts a high bit-width pulse-code modulation (PCM) input signal (e.g., PCM input signal 120) to a low bit-width pulse density modulation (PDM) output signal (e.g., PDM output signal 124) and a plurality of single bit-width pulse-width modulation (PWM) signals by filtering the PCM input signal with a loop filter (e.g., loop filter 104) and over-sampling the filtered PCM input signal with a delay-free poly-phase quantizer (e.g., quantizer 101). For example, a two-input loop filter generates a filtered signal based on the PCM input signal and a feedback (e.g., feedback 126) of the PDM output signal. A voltage ramp generator (e.g., voltage ramp generator 106) produces a voltage ramp signal that ramps-up a voltage to a maximum level and resets the voltage to repeat the ramp-up sequence. A plurality of delay elements (e.g., delay element 108a, 108b) separates the ramp signal into a plurality of delayed ramp signals. Both the filtered signal and the ramp signal drive the inputs of a PWM modulator (e.g., PWM modulator 110a) configured to generate a single bit-width PWM output signal (e.g., PWM output signal 122) responsive to the PCM input signal and the output of the ramp generator. The delta-sigma modulator 100 includes additional PWM modulators (e.g., PWM modulator 110b, 110c) configured to receive the filtered signal and select one of the delayed ramp signals. In other words, the differently delayed ramp-signals cause the PWM modulators to generate an array of poly-phase single bit-width PWM signals. A combiner (e.g., combiner 112) combines the poly-phase single bit-width PWM signals into a PDM output signal (e.g., PDM output signal 124) that routes back to the two-input loop filter. Accordingly, for each successive cycle of the PCM input signal, the delta-sigma modulator 100 generates an updated filtered signal that further suppresses quantization noise on both the array of single bit-width PWM signals and the combined low bit-width PDM output signal.

In greater detail, delta sigma modulator 100 includes a two-input loop filter 104 and a poly-phase quantizer 101. The poly-phase quantizer 101 includes a voltage ramp generator 106, two delay elements 108a, 108b, three PWM modulators 110a, 110b, 110c (shown in FIG. 1 as PWM 110a, PWM 110b, and PWM 110c), and a combiner 112. In some implementations, poly-phase quantizer 101 may omit loop filter 104. That is, delta sigma modulator 100 may be a standalone, poly-phase quantizer 101. In this configuration, delta sigma modulator 100 may be coupled to systems that produce a PCM signal (e.g., PCM input signal 120) that drive the input terminal of poly-phase quantizer 101. In some implementations, delta sigma modulator 100 may include one or more digital-to-analog converters (DAC) or one or more power amplifiers. Delta sigma modulator 100 may be implemented as an integrated circuit (IC), implemented using only discrete components, or implemented using any combination thereof. As will be discussed below, in another implementation, delta sigma modulator 100 can include fewer, additional, and/or different components.

A first input terminal of loop filter 104 couples to a signal source that produces a pulse-code modulation signal (e.g., PCM input signal 120), such as a PCM signal generator or any other upstream circuitry that provides a PCM signal. PCM input signal 120 is a digital representation of a sampled analog signal, such as audio. Although PCM input signal 120 is shown in FIG. 1 as a 24-bit PCM input signal, PCM input signal 120 may include any number of encoded bits or bit depths. For example, PCM input signal 120 may be 1-bit, 2-bit, 3-bit, 4-bit, 6-bit, 8-bit, 10-bit, 12-bit, 14-bit, 16-bit, 18-bit, 20-bit, 22-bit, 24-bit, 26-bit, 28-bit, 30-bit, 32-bit, 64-bit, 128-bit, 256-bit, or any unbounded combination thereof. An output terminal of loop filter 104 couples to first input terminals of PWM modulators 110a, 110b, 110c (collectively referred to as PWM modulators 110). An output terminal of voltage ramp generator 106 couples to an input terminal of delay element 108a and a second input terminal of PWM modulator 110a. An output terminal of delay element 108a couples to an input terminal of delay element 108b and a second input terminal of PWM 110b. An output terminal of delay element 108b couples to a second input terminal of PWM modulator 110c. Output terminals of PWM modulators 110a, 110b, 110c couple to a first input terminal, a second input terminal, and a third input terminal of combiner 112, respectively. An output terminal of combiner 112 (i.e., an output of quantizer 101) couples to a second input terminal of loop filter 104 by way of feedback path 126. In some implementations, delta sigma modulator 100 includes one or more digital-to-analog converters (DAC). For example, the output terminal of combiner 112 (e.g., PDM output signal 124) may couple to one or more input terminals of the one or more DACs. In some implementations, one or more output terminals of PWM modulators 110a, 110b, 110c may couple to one or more input terminals of the one or more DACs. In some implementations, delta sigma modulator 100 includes one or more power amplifiers. For example, the output terminal of combiner 112 (e.g., PDM output signal 124) may couple to input terminals of one or more power amplifiers. In some implementations, one or more output terminals of PWM modulators 110a, 110b, 110c may couple to input terminals of one or more power amplifiers.

The connections of loop filter 104, quantizer 101, and feedback 126 form a loop that shapes the quantization noise on the output signal of quantizer 101. For example, loop filter 104 compares its first input terminal (e.g., PCM input signal 120) with its second input terminal (e.g., PDM output signal 124 from quantizer 101), calculates a difference between the compared signals, and frequency weighs the difference to produce a filtered output signal. In other words, loop filter 104 passes frequency differences that fall within the signal band and suppresses frequency differences that fall outside the band. The filtered output signal drives the input terminal of quantizer 101 (e.g., first input terminals of PWM modulators 110a, 110b, 110c), which generates the next PDM output signal 124 that loop filter 104 uses in its next signal comparison. After successive iterations of the noise-shaping loop, PCM input signal 120 and PDM output signal 124 begin to form a match in the pass-band of loop filter 104, while the quantization errors fall outside of the signal band.

Loop filter 104 may be designed using standard delta-sigma techniques to tune the characteristics of PWM output 122 and PDM output signal 124. By way of a non-limiting example, loop filter 104 may be a Butterworth or Maximally Flat filter, a Chebyshev or Equal Ripple filter, a Cauer or Elliptic filter, a linear phase filter, a Bessel-Thomson filter, a Comb filter, a fixed bandpass filter, a tunable bandpass filter, a low-pass filter, a high-pass filter, a passband filter, a band-reject filter, a notch filter, or a programmable filter. In some implementations, loop filter 104 may include any number of integrator sections, feed-forward coefficients, and feed-back coefficients. In some implementations, loop filter 104 may provide low or high gain at either of low or high frequencies. In some implementations, loop filter 104 may be a low-order loop filter or a high-order loop filter. In some implementations, loop filter 104 may be an n-th order filter, for example, loop filter 104 may be a first-order filter, a second-order filter, a third-order filter, a fourth-order filter, a fifth-order filter, a sixth-order filter, a seventh-order filter, an eighth-order filter, a ninth-order filter, a tenth-order filter, an eleventh-order filter, or a twelfth-order filter.

Voltage ramp generator 106 generates a voltage ramp signal that ramps-up a voltage from a minimum voltage level to a maximum voltage level and resets the voltage to the minimum voltage level to repeat the ramp-up sequence. Voltage ramp generator 106 may generate a digital voltage. For example, voltage ramp generator 106 may increase the ramp voltage in fixed step sizes and for a fixed number of steps until the ramp signal reaches a maximum voltage step, at which point, voltage ramp generator 106 drops the ramp voltage back to the minimum voltage level to repeat the voltage step sequence. Voltage ramp generator 106 may step up the voltage in any number of voltage steps, for example, 1 step, 2 steps, 3 steps, 4 steps, 5 steps, 6 steps, 7 steps, 8 steps, 9 steps, 10 steps, and any unbounded combination thereof. A voltage step may equal to any amount of increasing voltage, for example, 1 mV, 10 mV, 100 mV, 200 mV, 300 mV, 400 mV, 500 mV, 600 mV, 700 mV, 800 mV, 900 mV, 1.0 V, and any unbounded combination thereof. Voltage ramp generator 106 may be an exponential charging ramp generator, a constant current charging ramp generator, a Miller integrator ramp generator, an RC ramp generator, a uni-junction transistor (UJT) relaxation oscillator ramp generator, or a bootstrap ramp generator. Voltage ramp generator 106 may generate a sawtooth wave, a triangular wave, a step, a pulse, or pulse train. In some implementations, voltage ramp generator may generate a sequence of reference voltages based on a transfer function of a digital word stored in a counter circuit.

Voltage ramp generator 106 drives a voltage ramp signal into the second input terminal of PWM modulator 110a and the input terminal of delay element 108a. Voltage ramp generator 106 may drive any number of PWM 110 modulators and delay elements 108 to support the generation of any number of single-bit poly-phase PWM signals (e.g., PWM output signal 122).

Associated with delay element 108a and delay element 108b is a time delay constant for signal propagation from the input terminal of each delay element to the output terminal of each respective delay element. For example, delay element 108a delays the output of voltage ramp generator 106 by a delay constant associated with delay element 108a. Delay element 108b delays the output of delay element 108a by a delay constant associated with delay element 108b. As a result of delay element 108a and delay element 108b, the voltage ramp signal at the input terminal of PWM modulator 110c is delayed more than the voltage ramp signal at the input terminal of PWM modulator 110b, and the voltage ramp signal at the at the input terminal of PWM modulator 110b is delayed more than the voltage ramp signal at the input terminal of PWM modulator 110a. Therefore, the output signals of PWM modulator 110a, 110b, 110c are also at different delays from one another. In some implementations, delay element 108b and delay element 108a have equal time delay constants. In some implementations, delay element 108a may equal one period of a sampling clock signal used to set the sampling frequency for delta sigma modulator 100. In some implementations, delay element 108b may equal one period of a sampling clock signal used to set the sampling frequency for delta sigma modulator 100. In some implementations, delay element 108b has a time delay constant less than the time delay constant associated with delay element 108a. In some implementations, delay element 108b has a time delay constant greater than the time delay constant associated with delay element 108a. Delay elements 108a, 108b may include buffers, flip-flops, a latch, combinational logic, inverters, AND gates, NAND gates, NOR gates, and a latch. In some implementations, the time delay constant may be a fixed value, a variable value, or programmable value.

PWM modulators 110a, 110b, 110c each generate a poly-phase single bit-width PWM signal by comparing the signal sensed on its first input terminal with the signal sensed on its second input terminal. First, PWM modulator 110a receives a filtered signal from loop filter 104 on its first input terminal and receives a voltage ramp signal directly from voltage ramp generator 106 on its second terminal, and compares the filtered signal with the voltage ramp signal to produce a first single bit-width PWM signal. In some implementations, PWM modulator 110a transitions a first single bit-width PWM signal into a high-voltage logic state if the voltage of the signal sensed on the first input terminal of PWM modulator 110a is greater than the voltage of the signal sensed on the second input terminal of PWM modulator 110a. In some implementations, PWM modulator 110a transitions a first single bit-width PWM signal into a low-voltage logic state if the voltage of the signal sensed on the first input terminal of PWM modulator 110a is less than the voltage of the signal sensed on the second input terminal of PWM modulator 110a. Second, PWM modulator 110b receives the same filtered signal from loop filter 104 on its first input terminal and receives a delayed voltage ramp signal from the output of delay element 108a on its second terminal, and compares the filtered signal with the delayed voltage ramp signal to produce a second single bit-width PWM signal. Third, PWM modulator 110c receives the same filtered signal from loop filter 104 on its first input terminal and receives a delayed voltage ramp signal from the output of delay element 108b on its second terminal, and compares the filtered signal with the delayed voltage ramp signal to produce a third single bit-width PWM signal. Since each PWM modulator receives a differently delayed ramp signal, PWM modulators 110a, 110b, 110c produce an array of poly-phase single bit-width PWM signals to drive combiner 112. That is, PWM modulators 110a, 110b, 110c and combiner 112 collectively convert a high bit-width PCM signal (e.g., PCM input signal 120) into a low bit-width PDM signal (e.g., PDM output signal 124) within a single conversion stage removing the need for external digital filtering.

Combiner 112 has multiple input terminals and one output adapted to add the signals sensed on its inputs to produce a combined pulse-density modulation or PDM signal (e.g., PDM output signal 124) on its output. A PDM signal is a digital representation of a sampled analog signal, such as audio, where the relative density of the pulses corresponds to the analog signal's amplitude. Although PDM output signal 124 is shown in FIG. 1 as a 5-bit PDM output signal, PDM output signal 124 may include any number of encoded bits or bit depth size, for example, PDM output signal 124 may be 1-bit, 2-bit, 3-bit, 4-bit, 6-bit, 8-bit, 10-bit, 12-bit, 14-bit, 16-bit, 18-bit, 20-bit, 22-bit, 24-bit, 26-bit, 28-bit, 30-bit, 32-bit, 64-bit, 128-bit, 256-bit, or any unbounded combination thereof. A high bit-width PCM signal has a larger bit-width than a low bit-width PDM signal. Conversely, a low bit-width PCM signal has a smaller bit-width than a high bit-width PCM signal. As shown in FIG. 1, combiner 112 combines the single bit-width output of PWM modulator 110a, the single bit-width output of PWM modulator 110b, and the single bit-width output of PWM modulator 110c to produce a low bit-width PDM signal (e.g., PDM output signal 124) on its output. Combiner 112 combines signals on its input terminals by adding the logic state of each input signal at the same point in time and producing a signal on its output to represent the addition of the logic states at that same point in time. In some implementations, PDM output signal 124 exactly equals the summation of each PWM modulator 110a, 110b, 110c output signal. In some implementations, PDM output signal 124 significantly equals the summation of each PWM modulator 110a, 110b, 110c output signal.

The components shown in FIG. 1 may have an alternate configuration. For example, one implementation of delta sigma modulator 100 may position the connection for feedback path 126 prior to combiner 112. As such, feedback 126 may connect to the output of PWM 110a, the output of PWM 110b, or the output of PWM 110c. In other implementations, delta sigma modulator 100 may support the conversion of a PCM signal (e.g., PCM input 12) to a PDM signal (e.g., PDM output signal 124) having any number of bit-widths. Accordingly, delta sigma modulator 100 may include additional PWM modulators 110 and delay elements 108 to support an increase in bit-width for PDM output signal 124. For example, PDM output signal 124 shown in FIG. 1 is the combination of three single-bit PWM signals from three PWM modulators 110. To increase PDM signal from a 3-bit width signal to a 4-bit width signal, one PWM modulator 110d (not shown) and one delay element 108c (not shown) may be added. In the alternate configuration, delay element 108b couples to the input terminal of delay element 108c, whose output couples to the second input terminal of PWM 110d, whose first input terminal couples to the output of loop filter 104. Additional bits may be added to PDM output signal 124 by connection additional PWM modulations 110 and delay elements 108 as described above. In other implementations, delta sigma modulator 100 may include a switch placed between combiner 112 and loop filter 104 to bypass the feedback path 126 of PDM output signal 124. For example, delta sigma modulator 100 may bypass feedback path 126 by opening the switch when the SNDR of PDM output signal 124 exceeds a predetermined threshold value. Delta sigma modulator 100 may engage the feedback path 126 by closing the switch when the SNDR of PDM output signal 124 falls below a predetermined threshold value. In some implementations, a processor or modem may control the opening and closing of the switch based on the SNDR of PDM output signal 124, the SNDR of output of PWM 110a, the SNDR of output of PWM 110b, or the SNDR of output of PWM 110c.

Figure 2:
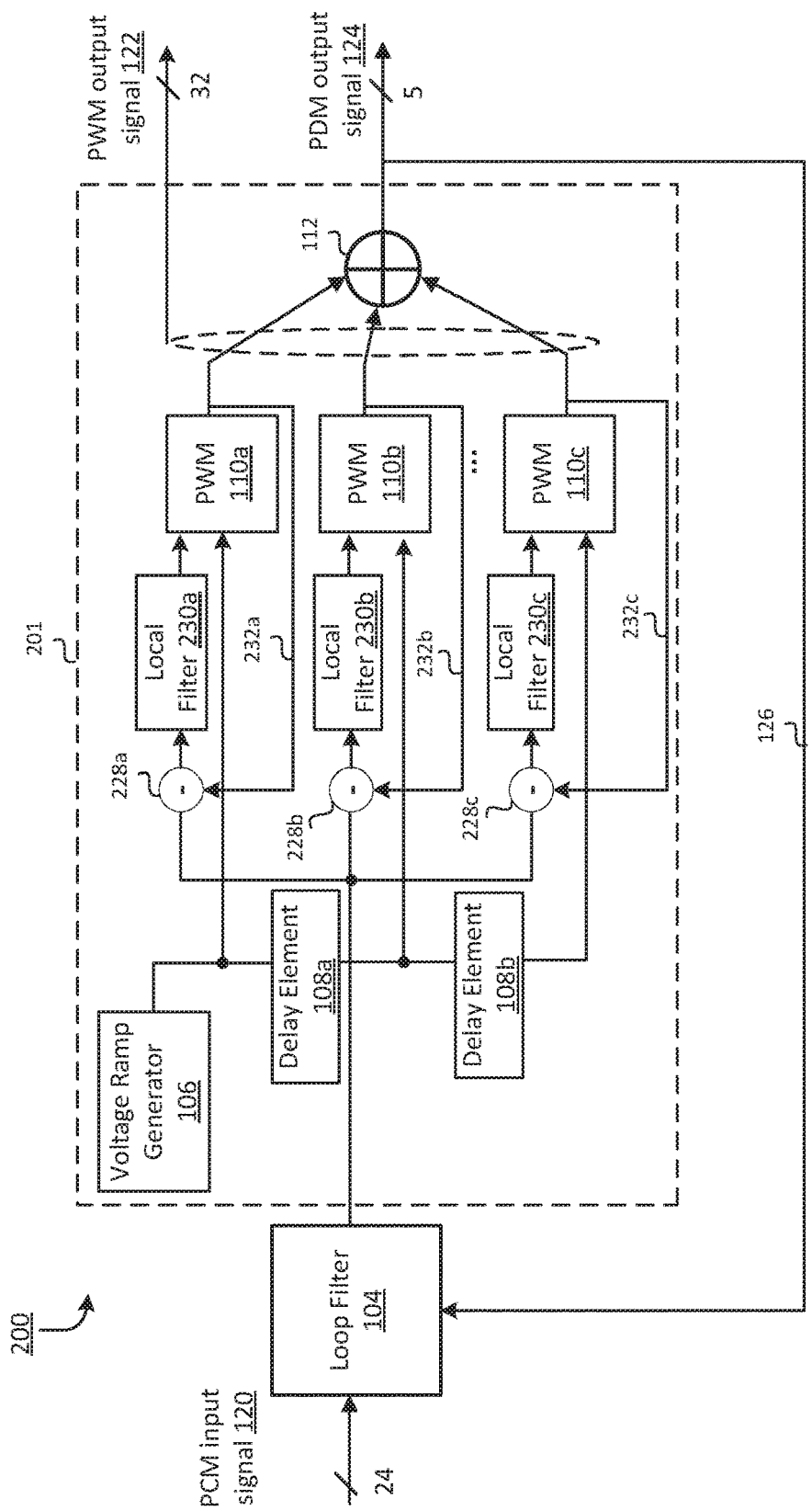
FIG. 2 is a block diagram depicting a delta-sigma modulator 200 including a delay-free poly-phase quantizer with local feedback for pulse-width modulation (PWM) mismatch shaping to suppress quantization noise, in accordance with an illustrative implementation.

FIG. 2 is a block diagram depicting a delta-sigma modulator 200 including a delay-free poly-phase quantizer with local feedback for pulse-width modulation (PWM) mismatch shaping to suppress quantization noise of each single-bit PWM signal, in accordance with an illustrative implementation. Delta sigma modulator 200 includes a two-input loop filter 104 and a poly-phase quantizer 201. The poly-phase quantizer 201 includes a voltage ramp generator 106, two delay elements 108a, 108b, three PWM modulators 110a, 110b, 110c (shown in FIG. 2 as PWM 110a, PWM 110b, and PWM 110c), a combiner 112, three subtractors 228a, 228b, 228c, and three local filters 230a, 230b, 230c. In some implementations, poly-phase quantizer 201 may omit loop filter 104. That is, delta sigma modulator 200 may be a standalone, poly-phase quantizer 201. In this configuration, delta sigma modulator 200 may be coupled to systems that produce a PCM output signal (e.g., PCM input signal 120) that drive the input terminal of poly-phase quantizer 201. In some implementations, delta sigma modulator 200 may include one or more digital-to-analog converters (DAC) or one or more power amplifiers. Delta sigma modulator 200 may be implemented as an integrated circuit (IC), implemented using only discrete components, or implemented using any combination thereof.

Still referring to FIG. 2, the first input terminal of loop filter 104 couples to a signal source that produces a pulse-code modulation signal (e.g., PCM input signal 120), such as a PCM signal generator or any other upstream circuitry that provides a PCM signal. The output terminal of loop filter 104 couples to the first input terminals of subtractors 228a, 228b, 226c. The output terminal of subtractor 228a couples to the input terminal of local filter 230a, whose output couples to the first input terminal of PWM modulator 110a.

The output terminal of subtractor 228b couples to the input terminal of local filter 230b, whose output couples to the first input terminal of PWM modulator 110b. The output terminal of subtractor 228c couples to the input terminal of local filter 230c, whose output couples to the first input terminal of PWM modulator 110c. The output of voltage ramp generator 106 couples to the input terminal of delay element 108a and the second input terminal of PWM modulator 110a. The output of delay element 108a couples to the input terminal of delay element 108b and the second input terminal of PWM 110b. The output of delay element 108b couples to the second input terminal of PWM modulator 110c. The outputs of PWM modulators 110a, 110b, 110c couple to the first input terminal, second input terminal, and third input terminal of combiner 112, respectively. In addition, the output terminal of PWM modulator 110a couples (via feedback 232a) to the second input terminal of subtractor 228a, the output of PWM modulator 110b couples (via feedback 232b) to the second input terminal of subtractor 228b, and the output of PWM modulator 110c couples (via feedback 232c) to the second input terminal of subtractor 228c. The output of combiner 112 (i.e., the output of quantizer 201) couples to the second input terminal of loop filter 104 by way of feedback 126. In some implementations, delta sigma modulator 200 includes one or more digital-to-analog converters (DAC). For example, the output of combiner 112 (e.g., PDM output signal 124) may couple to one or more input terminals of the one or more DACs. In some implementations, one or more outputs of PWM modulators 110a, 110b, 110c may couple to one or more input terminals of the one or more DACs. In some implementations, delta sigma modulator 200 includes one or more power amplifiers. For example, the output of combiner 112 (e.g., PDM output signal 124) may couple to the input terminals of one or more power amplifiers. In some implementations, one or more outputs of PWM modulators 110a, 110b, 110c may couple to the input terminals of one or more power amplifiers.

Similar to the delta sigma modulator 100 shown in FIG. 1, the delta sigma modulator 200 converts a high bit-width PCM input signal to a low bit-width PDM output signal and a plurality of single bit-width PWM signals by filtering the PCM input signal with a loop filter and over-sampling the filtered PCM input signal with a delay-free poly-phase quantizer. However, delta sigma modulator 200 also includes a local feedback configuration (e.g., a subtractor, a filter, and a feedback path) specific to each PWM modulator 110a, 110b, 110c to enhance the SNDR for the generated single-bit PWM signals (e.g., PWM output signal 122) and the constructed PDM signal (e.g., PDM output signal 124). As a result, delta sigma modulator 200 may produce output signals with improved tolerance to driving a DAC having mismatching elements.

Each local feedback configuration forms a loop that shapes the quantization noise on the output signal of a PWM modulator. For example, subtractors 228a, 228b, 228c each have two input terminals and one output terminal adapted to subtract the signal sensed on its second input terminal from the signal sensed on its first input terminal to produce a corrected signal on its output terminal. As shown in FIG. 2, subtractors 228a, 228b, 228c each subtract the single bit-width PWM signal output of their respective PWM modulator 110a, 110b, 110c from the filtered signal output of loop filter 104 to produce a first, second, and third corrected signal. Local filter 230a filters the first corrected signal to produce a first filtered signal, local filter 230b filters the second corrected signal to produce a second filtered signal, and local filter 230c filters the third corrected signal to produce a third filtered signal. PWM modulators 110a, 110b, 110c each produce an updated single bit-width PWM output signal based on the updated filtered signals. Feedback 232a, 232b, 232c route the updated outputs of PWM modulators 110a, 110b, 110c back to the second input terminal of their respective subtractor 228a, 228b, 228c. Successive iterations of the subtracting and filtering aids in the suppression of quantization noise from PWM modulators 110a, 110b, 110c.

Local filters 230a, 230b, 230c (collectively referred to as local filters 230) may be designed using standard delta-sigma techniques to tune the characteristics of PWM output 122 and PDM output signal 124. By way of a non-limiting example, local filters 230 may be a Butterworth or Maximally Flat filter, a Chebyshev or Equal Ripple filter, a Cauer or Elliptic filter, a linear phase filter, a Bessel-Thomson filter, a Comb filter, a fixed bandpass filter, a tunable bandpass filter, a low-pass filter, a high-pass filter, a passband filter, a band-reject filter, a notch filter, or a programmable filter. In some implementations, local filters 230 may provide gain at low frequencies, such as low gain or high gain. In some implementations, local filters 230 may provide gain at high frequencies, such as low gain or high gain. In some implementations, local filters 230 may be a low-order loop filter or a high-order loop filter. In some implementations, local filters 230 may n-th order filters, for example, local filters 230 may be a first-order filter, a second-order filter, a third-order filter, a fourth-order filter, a fifth-order filter, a sixth-order filter, a seventh-order filter, an eighth-order filter, a ninth-order filter, a tenth-order filter, an eleventh-order filter, or a twelfth-order filter.

Figure 3:
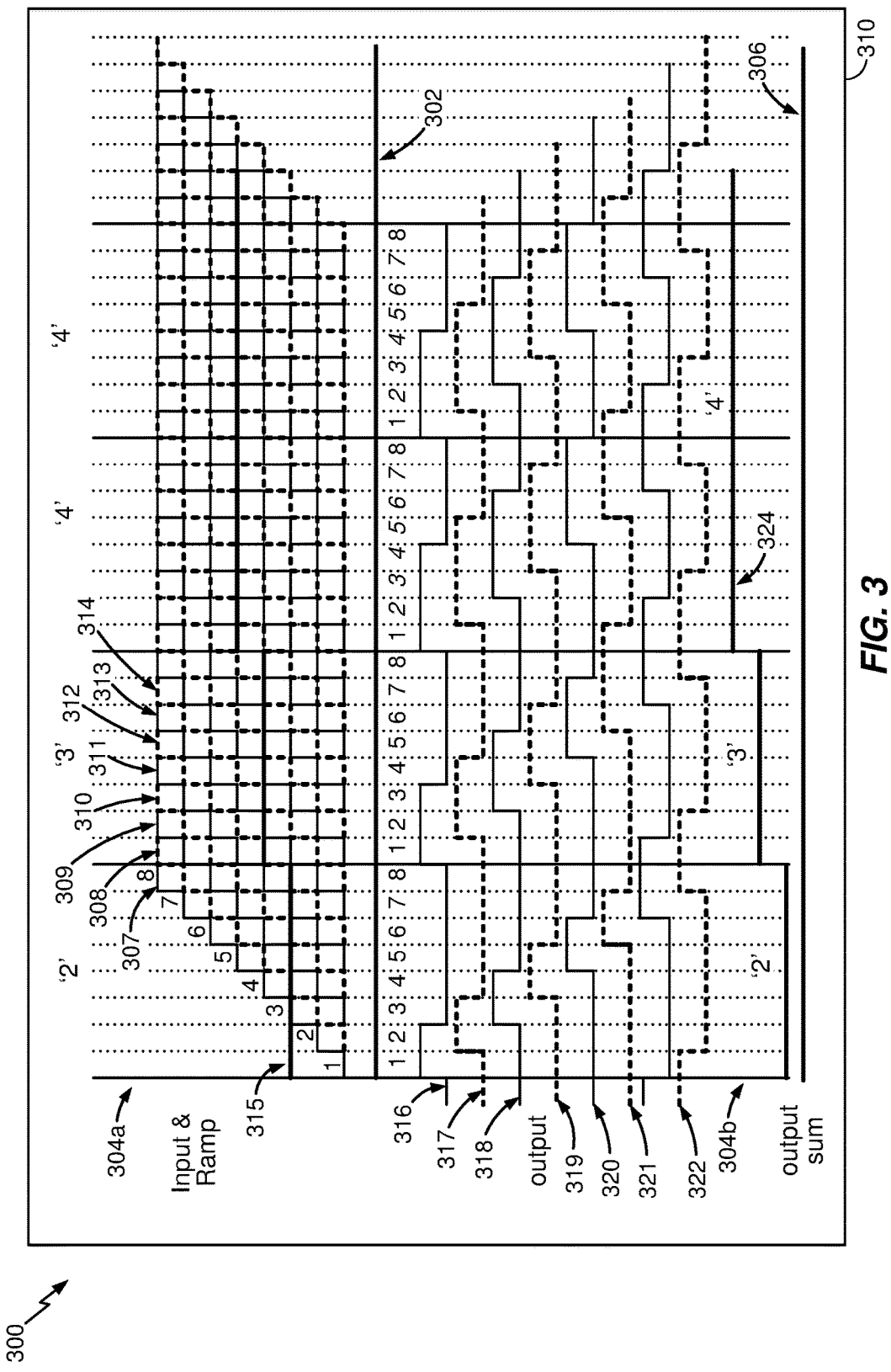
FIG. 3 is a time-based graph depicting input and output waveforms of a delay-free poly-phase quantizer for pulse-width modulation (PWM) mismatch shaping to suppress quantization noise, in accordance with an illustrative implementation.

FIG. 3 is a time-based graph depicting input and output waveforms of a delay-free poly-phase quantizer for pulse-width modulation (PWM) mismatch shaping to suppress quantization noise, in accordance with an illustrative implementation. The graph illustrates superimposed waveforms above split 302 and stacked waveforms below split 302. Waveforms 307, 308, 309, 310, 311, 312, 313, 314, shown above split 302, represent the amplitudes of eight differently delayed voltage ramp signals into the second input terminal of eight PWM modulators, such as PWM modulator 110 in FIGS. 1 and 2, plotted on Y-axis 304a as a function of time along X-axis 306. Waveforms 307, 308, 309, 310, 311, 312, 313, 314 start at the same minimum voltage level, increase the voltage in the same number of steps and using the same step size, and reach the same maximum voltage level before returning to the same minimum voltage level to repeat the sequence. Waveform 315, also shown above split 302, represents the amplitude of a PCM data signal, such as from the output of loop filter 104 in FIGS. 1 and 2, into the first input terminal of each the eight PWM modulators.

Waveforms 316, 317, 318, 319, 320, 321, 322, shown below split 302, represent amplitudes of the eight single bit-width PWM signals produced by the eight PWM modulators (e.g., PWM output signal 122), plotted on Y-axis 304b as a function of time along X-axis 306. Waveforms 316, 317, 318, 319, 320, 321, 322 are shown stacked for clarity only and do not indicate that the waveforms vary from different voltage ranges. For example, waveforms 316, 317, 318, 319, 320, 321, 322 each have the same minimum voltage level for logic state '0' and the same maximum voltage level for logic state '1'. Waveform 324, also shown below split 302, represents the summation of the eight single bit-width PWM signals produced on the output of a combiner, such as PDM output signal 124 produced on the output terminal of combiner 112.

Figure 4:
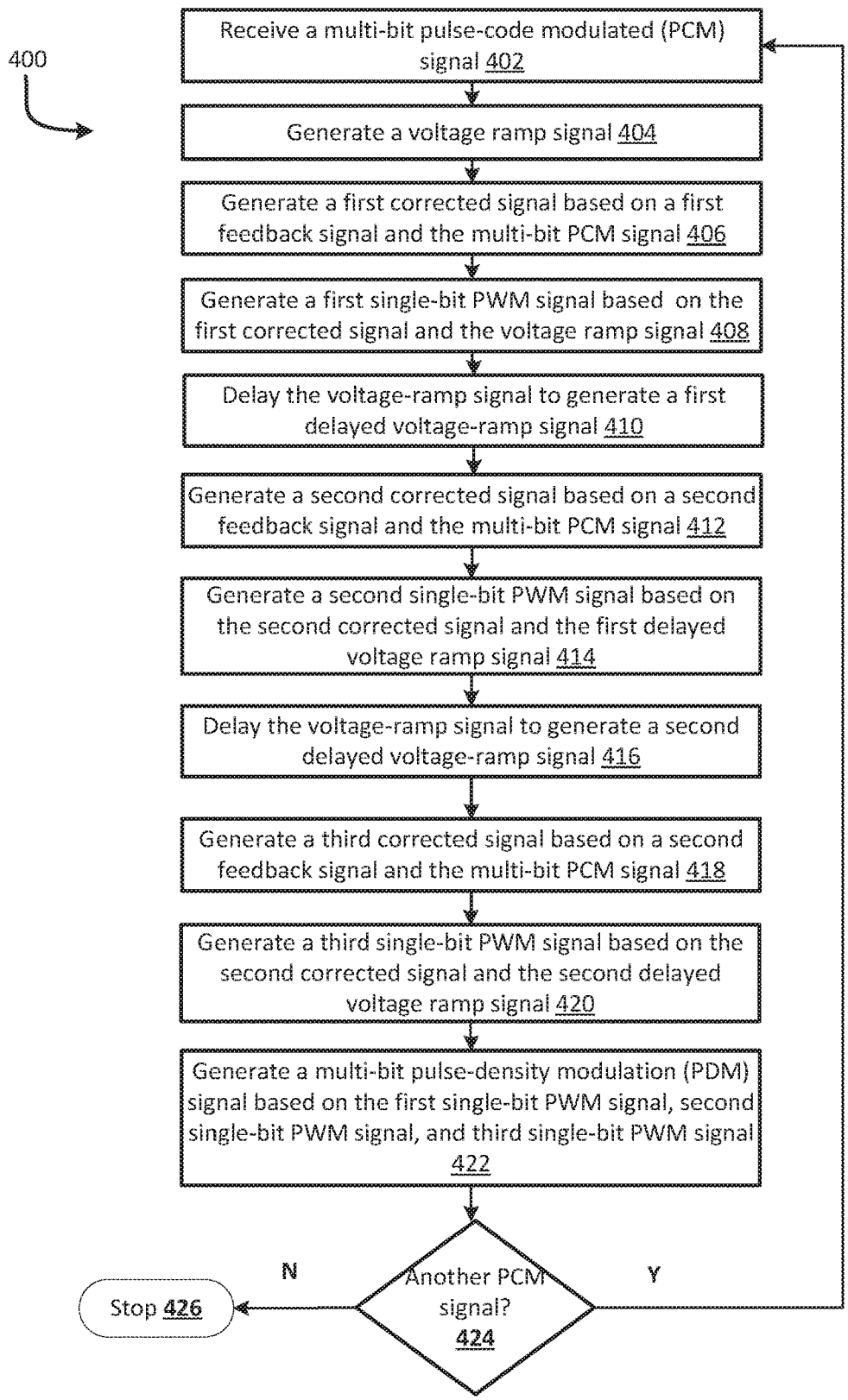
FIG. 4 is a flow diagram depicting a quantization process 400 for pulse-width modulation mismatch shaping to suppress quantization noise, in accordance with an illustrative implementation.

FIG. 4 is a flow diagram depicting a quantization process 400 for pulse-width modulation mismatch shaping to suppress quantization noise, in accordance with an illustrative implementation. Additional, fewer, or different operations may be performed depending on the implementation of the process. The process 400 may be implemented by a system such as the delta sigma modulator 100 of FIG. 1 or 200 of FIG. 2. At operation 402, the system receives a multi-bit pulse-code modulated input signal (e.g., PCM input signal 120) representing a digitized analog signal (such as audio) at the input of a loop filter (e.g., loop filter 104). The PCM input signal may have a bit depth comprising any number of bits, for example, the PCM input signal may be 1-bit, 2-bit, 3-bit, 4-bit, 6-bit, 8-bit, 10-bit, 12-bit, 14-bit, 16-bit, 18-bit, 20-bit, 22-bit, 24-bit, 26-bit, 28-bit, 30-bit, 32-bit, 64-bit, 128-bit, 256-bit, or any unbounded combination thereof. In some implementations, the system receives an analog signal and converts the analog signal to a PCM signal.

At operation 404, the system generates a voltage ramp signal that systematically ramps-up a voltage to a maximum voltage level and rapidly drops the voltage to a minimum voltage level to repeat the ramp-up sequence. For example, the system, such as voltage ramp generator 106, may begin a ramp signal at a minimum voltage level (e.g., a negative voltage, a zero voltage, or a positive voltage) and increase the voltage by a fixed step size and for a fixed number of steps. When the voltage reaches a maximum voltage level, the system repeats the sequence by resetting the ramp voltage back to the minimum voltage level and repeating the ramp-up procedure. A voltage step size may equal to any amount of increasing voltage, for example, 1 mV, 10 mV, 100 mV, 200 mV, 300 mV, 400 mV, 500 mV, 600 mV, 700 mV, 800 mV, 900 mV, 1.0 V, and any unbounded combination thereof. In some implementations, the voltage step size may vary from step to step. For example, the voltage may increase by 100 mV for step 0, the voltage may increase by 200 mv for step 1, and the voltage may increase by 300 my for step 3.

At operation 406, the system generates a first corrected signal based on a first feedback signal and the multi-bit PCM signal. For example, the system receives a first feedback signal (e.g., feedback 232*a*) generated by a PWM modulator (e.g., PWM modulator 110*a*). The system compares the first feedback signal to a multi-bit PCM signal to produce a first corrected signal having an amplitude proportional to the compared signals. In some implementations, the system subtracts the amplitude of the first feedback signal from the amplitude of the multi-bit PCM signal to produce the first corrected signal. In some implementations, the first feedback signal and the multi-bit PCM signal are stored as arrays and the subtraction may be accomplished using an element-wise subtraction. For example, if $X=\{X_1, X_2, \ldots X_n\}$ represents the multi-bit PCM signal and $W=\{W_1, W_2, \ldots W_n\}$ represents the first feedback signal then the subtraction of W from X may be shown as $Y=\{X_1-W_1, X_2-W_2, \ldots X_n-W_n\}$. Thus, if the multi-bit PCM signal and the first feedback signal are identical in amplitude, then the subtraction of the two signals results in a first corrected signal with an amplitude of zero.

At operation 408, the system generates a first single-bit PWM signal based on the first corrected signal and the voltage ramp signal. For example, the system compares (via a PWM modulator, such as PWM modulator 110*a*) the first corrected signal and the voltage ramp signal to generate a first single-bit PWM signal. In some implementations, PWM modulator 110*a* transitions a first single bit-width PWM signal into a high-voltage logic state if the voltage of the signal sensed on the first input terminal of PWM modulator 110*a* is greater than the voltage of the signal sensed on the second input terminal of PWM modulator 110*a*. In some implementations, PWM modulator 110*a* transitions a first single bit-width PWM signal into a low-voltage logic state if the voltage of the signal sensed on the first input terminal of PWM modulator 110*a* is less than the voltage of the signal sensed on the second input terminal of PWM modulator 110*a*. In some implementations, the system filters the first corrected signal prior to comparing the signal to the voltage ramp signal.

At operation 410, the system delays the voltage-ramp signal by splitting the voltage ramp signal generated at operation 402 into a second path signal and delaying the second path signal by a first delay value to produce a first delayed voltage ramp signal. For example, the system stores the voltage ramp signal in a buffer and releases the voltage ramp signal when a timer equals the first delay value. In some implementations, the system latches the voltage-ramp signal into a latch clocked by a signal that has a rising edge occur at a time equal to the first delay value. In some implementations, the system may delay the voltage-ramp signal by propagating the voltage-ramp signal through a series of latches connected to a common clock bus. The total number of latches (n) may be selected based on the number of latches that result in a total propagation delay (from input of the first latch to the output of the n-th latch) equal to first delay value. In some implementations, the time delay value may be a fixed value, a variable value, or programmable value.

At operation 412, the system generates a second corrected signal based on a second feedback signal and the multi-bit PCM signal. For example, the system receives a second feedback signal (e.g., feedback 232*b*) generated by a PWM modulator (e.g., PWM modulator 110*b*). The system compares the second feedback signal to a multi-bit PCM signal to produce a second corrected signal having an amplitude proportional to the compared signals. In some implementations, the system subtracts the amplitude of the second feedback signal from the amplitude of the multi-bit PCM signal to produce the second corrected signal. In some implementations, the second feedback signal and the multi-bit PCM signal are stored as arrays and the subtraction may be accomplished using an element-wise subtraction.

At operation 414, the system generates a second single-bit PWM signal based on the second corrected signal and the first delayed voltage ramp signal. For example, the system compares (via a PWM modulator, such as PWM modulator 110*b*) the second corrected signal and the first delayed voltage ramp signal to generate a second single-bit PWM signal. In some implementations, the system filters the second corrected signal prior to comparing the signal to the first delayed voltage ramp signal.

At operation 416, the system delays the first delayed voltage ramp signal by a second delay value to produce a second delayed voltage ramp signal. For example, the system stores the first delayed voltage ramp signal in a buffer and releases the first delayed voltage ramp signal when a timer equals the second delay value. In some implementations, the system latches the first delayed voltage-ramp signal into a latch clocked by a signal that has a rising edge occur at a time equal to the second delay value. In some implementations, the system may delay the first delayed voltage-ramp signal by propagating the first delayed voltage-ramp signal through a series of latches connected to a common clock bus. The total number of latches (n) may be selected based on the number of latches that result in a total propagation delay (from input of the first latch to the output of the n-th latch) equal to second delay value. In some implementations, the second time delay value may be a fixed value, a variable value, or programmable value At operation 418, the system generates a third corrected signal based on a third feedback signal and the multi-bit PCM signal. For example, the system receives a third feedback signal (e.g., feedback 232*c*) generated by a PWM modulator (e.g., PWM modulator 110*c*). The system compares the third feedback signal to a multi-bit PCM signal to produce a third corrected signal having an amplitude proportional to the compared signals. In some implementations, the system subtracts the amplitude of the third feedback signal from the amplitude of the multi-bit PCM signal to produce the third corrected signal. In some implementations, the third feedback signal and the multi-bit PCM signal are stored as arrays and the subtraction may be accomplished using an element-wise subtraction.

At operation 420, the system generates a third single-bit PWM signal based on the third corrected signal and the second delayed voltage ramp signal. For example, the system compares (via a PWM modulator, such as PWM modulator 110*b*) the third corrected signal and the second delayed voltage ramp signal to generate a third single-bit PWM signal. In some implementations, the system filters the third corrected signal prior to comparing the signal to the second delayed voltage ramp signal.

At operation 422, the system generates a multi-bit pulse-density modulation (PDM) signal based on the first single-bit PWM signal, second single-bit PWM signal, and third single-bit PWM signal. For example, the system compares the amplitudes of the first single-bit PWM signal, second single-bit PWM signal, and third single-bit PWM signal to produce a multi-bit PDM signal having an amplitude proportional to the compared signals. In some implementations, the system adds the amplitudes of the first single-bit PWM signal, second single-bit PWM signal, and third single-bit PWM signal. In some implementations, the system stores the first single-bit PWM signal, the second single-bit PWM signal, and the third single-bit PWM signal as separate arrays and adds the signals using an element-wise addition.

At operation 424, the system checks whether an additional multi-bit PCM signal requires processing. If yes, then the system proceeds back to operation 402 to repeat process 400; otherwise, the system proceeds to operation 426 to stop process 400.

The various implementations illustrated and described are provided merely as examples to illustrate various features of the claims. However, features shown and described with respect to any given implementation are not necessarily limited to the associated implementation and may be used or combined with other implementations that are shown and described. Further, the claims are not intended to be limited by any one example implementation.

The foregoing method descriptions and the process flow diagrams are provided merely as illustrative examples and are not intended to require or imply that the steps of various implementations must be performed in the order presented. As will be appreciated by one of skill in the art the order of steps in the foregoing implementations may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the implementations disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary implementations, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The term "coupled" disclosed in this description may encompass both direct and indirect coupling. Thus, first and second parts are said to be coupled together when they directly contact one another, as well as when the first part couples to an intermediate part which couples either directly or via one or more additional intermediate parts to the second part. The term "substantially" or "about" may encompass a range that is largely, but not necessarily wholly, that which is specified. It encompasses all but a significant amount. When devices or components of the delta sigma modulator are responsive to events, the actions and/or steps of devices, such as the operations that other devices are performing, necessarily occur as a direct or indirect result of the preceding events and/or actions. In other words, the operations occur as a result of the preceding operations. A device that is responsive to another requires more than an action (i.e., the device's response to) merely follow another action.

The preceding description of the disclosed implementations is provided to enable any person skilled in the art to make or use the present disclosure. Various modifications to these implementations will be readily apparent to those skilled in the art, and the generic principles defined herein may be applied to some implementations without departing from the spirit or scope of the disclosure. Thus, the present disclosure is not intended to be limited to the implementations shown herein but is to be accorded the widest scope consistent with the following claims and the principles and novel features disclosed herein.

What is claimed is:

1. A delta-sigma modulator for pulse-width modulation (PWM) mismatch shaping, the delta-sigma modulator comprising:
   a first PWM modulator having a first input terminal, a second input terminal, and an output terminal;
   a voltage ramp generator having an output terminal coupled to the second input terminal of the first PWM modulator;
   a first delay element having an input terminal and an output terminal, the input terminal of the first delay element being coupled to the output terminal of the voltage ramp generator;
   a second PWM modulator having a first input terminal coupled to the first input terminal of the first PWM modulator, a second input terminal, and an output terminal, the second input terminal of the second PWM modulator being coupled to the output terminal of the first delay element;
   a second delay element having an input terminal coupled to the output terminal of the first delay element;
   a third PWM modulator having a first input terminal coupled to the first input terminal of the first PWM modulator and a second input terminal coupled to the output terminal of the second delay element; and
   a loop filter having a first input terminal, a second input terminal, and an output terminal, the output terminal of the loop filter coupled to the first input terminal of the first PWM modulator and to the first input terminal of the second PWM modulator.

2. The delta-sigma modulator of claim 1, wherein the voltage ramp generator generates a sequence of reference voltages based on a transfer function of a digital word stored in a counter circuit.

3. The delta-sigma modulator of claim 1, further comprising a combiner having a first input terminal coupled to the output terminal of the first PWM modulator, a second input terminal coupled to the output terminal of the second PWM modulator, and an output terminal coupled to the second input terminal of the loop filter.

4. The delta-sigma modulator of claim 3, wherein the loop filter being adapted to receive a multi-bit pulse code modulated (PCM) signal and the combiner being adapted to generate a multi-bit pulse density modulated (PDM) signal.

5. The delta-sigma modulator of claim 4, wherein the first PWM modulator generates a first single-bit PWM signal and the second PWM modulator generates a second single-bit PWM signal.

6. The delta-sigma modulator of claim 5, wherein the first PWM modulator generates a first single-bit PWM signal by comparing a first voltage on the first terminal of the first PWM modulator to a second voltage on the second input terminal of the first PWM modulator.

7. The delta-sigma modulator of claim 1, wherein the first delay element delays a signal by a first delay amount, wherein the second delay element delays a signal by a second delay amount, and wherein the first delay amount and the second delay amount being equal to one period of a sampling clock signal.

8. A delta-sigma modulator for pulse-width modulation (PWM) mismatch shaping, the delta-sigma modulator comprising:
   a first PWM modulator having a first input terminal, a second input terminal, and an output terminal;
   a voltage ramp generator having an output terminal coupled to the second input terminal of the first PWM modulator;
   a second PWM modulator having a first input terminal, a second input terminal, and an output terminal;
   a local filter having an input terminal and an output terminal, the output terminal of the local filter being coupled to the first input terminal of the first PWM modulator;
   a subtractor having a first and second input terminal and an output terminal, the output terminal being coupled to the input terminal of the local filter; and
   a loop filter having a first input terminal, a second input terminal, and an output terminal, the output terminal of the loop filter being coupled to the first input terminal of the subtractor.

9. The delta-sigma modulator of claim 8, further comprising:
   another local filter having an input terminal and an output terminal, the output terminal of the other local filter being coupled to the first input terminal of the second PWM modulator; and
   another subtractor having first and second input terminals and an output terminal, the output terminal being coupled to the input terminal of the other local filter.

10. The delta-sigma modulator of claim 8, wherein the voltage ramp generator generates a sequence of reference voltages based on a transfer function of a digital word stored in a counter circuit.

11. The delta-sigma modulator of claim 8, the second input terminal of the subtractor being coupled to the output terminal of the first PWM modulator.

12. The delta-sigma modulator of claim 11, further comprising a first delay element having an input terminal coupled to the output terminal of the voltage ramp generator and an output terminal coupled to the second input terminal of the second PWM modulator.

13. The delta-sigma modulator of claim 12, the delta-sigma modulator further comprising:
   a second delay element having an input terminal coupled to the output terminal of the first delay element; and a third PWM modulator having a first input terminal coupled to the output terminal of a second local filter and a second input terminal coupled to the output terminal of the second delay element.

14. The delta-sigma modulator of claim 13, wherein the first delay element delays a signal by a first delay amount, the second delay element delays a signal by a second delay amount, and the first delay amount and the second delay amount being equal to one period of a sampling clock.

15. The delta-sigma modulator of claim 12, further comprising a combiner having a first input terminal coupled to the output terminal of the first PWM modulator, a second input terminal coupled to the output terminal of the second PWM modulator, and an output terminal coupled to the second input terminal of the loop filter.

16. The delta-sigma modulator of claim 15, wherein the loop filter is adapted to receive a multi-bit pulse code modulated (PCM) signal and the combiner is adapted to generate a multi-bit pulse density modulated (PDM) signal.

17. The delta-sigma modulator of claim 12, wherein the first PWM modulator generates a first single-bit PWM signal and the second PWM modulator generates a second single-bit PWM signal.

18. The delta-sigma modulator of claim 17, wherein the first PWM modulator generates a first single-bit PWM signal by comparing a first voltage on the first terminal of the first PWM modulator to a second voltage on the second input terminal of the first PWM modulator.

19. A method for pulse-width modulation (PWM) mismatch shaping, the method comprising:
receiving a multi-bit pulse-code modulated (PCM) signal;
generating a voltage ramp signal;
generating a first corrected signal based on a first feedback signal and the multi-bit PCM signal;
generating a first single-bit PWM signal based on the first corrected signal and the voltage ramp signal;
delaying the voltage-ramp signal;
generating a second corrected signal based on a second feedback signal and the multi-bit PCM signal;
generating a second single-bit PWM signal based on the second corrected signal and the delayed voltage ramp signal; and
generating a multi-bit pulse-density modulation (PDM) signal based on the first single-bit PWM signal and the second single-bit PWM signal.

20. The method of claim 19, wherein generating the first corrected signal comprises subtracting the first feedback signal from the multi-bit PCM signal, and wherein generating the second corrected signal comprises subtracting the second feedback signal from the multi-bit PCM signal.

21. The method of claim 19, wherein generating a first single-bit PWM signal comprises comparing the first corrected signal and the voltage ramp signal, and wherein generating a second single-bit PWM signal comprises comparing the second corrected signal and the delayed voltage ramp signal.

22. The method of claim 21, wherein the first corrected signal being filtered prior to generating the first single-bit PWM signal, and wherein the second corrected signal being filtered prior to generating the second single-bit PWM signal.

23. The method of claim 22, wherein generating a multi-bit pulse-density modulation (PDM) signal comprises combining the first single-bit PWM signal and the second single-bit PWM signal.

24. The method of claim 19, further comprising generating a multi-bit PWM signal based on the first single-bit PWM signal and the second single-bit PWM signal.

25. The method of claim 19, wherein the multi-bit PCM signal being generated based on integrating a second multi-bit PCM signal and the multi-bit PDM signal.

26. The method of claim 19, wherein the multi-bit PCM signal being generated based on integrating a second multi-bit PCM signal and the first single-bit PWM signal.

27. A non-transitory computer readable storage medium configured to store instructions that, when executed by one or more processors of a device, cause the device to perform operations comprising:
generating a multi-bit pulse-code modulated (PCM) signal;
generating a voltage ramp signal;
generating a first corrected signal based on a first feedback signal and the multi-bit PCM signal;
generating a first single-bit pulse-width modulation (PWM) signal based on the first corrected signal and the voltage ramp signal;
delaying the voltage-ramp signal;
generating a second corrected signal based on a second feedback signal and the multi-bit PCM signal;
generating a second single-bit PWM signal based on the second corrected signal and the delayed voltage ramp signal; and
generating a multi-bit pulse-density modulation (PDM) signal based on the first single-bit PWM signal and second single-bit PWM signal.

28. The non-transitory computer readable storage medium of claim 27, wherein the multi-bit PCM signal being generated based on integrating a second multi-bit PCM signal and the multi-bit PDM signal.

* * * * *